United States Patent
Melamed-Kohen et al.

(10) Patent No.: US 9,804,224 B2
(45) Date of Patent: Oct. 31, 2017

(54) INTEGRATED CIRCUIT AND METHOD OF OPERATING AN INTEGRATED CIRCUIT

(71) Applicants: Eyal Melamed-Kohen, Modiin (IL); Ilan Cohen, Elad (IL); Shlomi Sde-Paz, Kadima (IL)

(72) Inventors: Eyal Melamed-Kohen, Modiin (IL); Ilan Cohen, Elad (IL); Shlomi Sde-Paz, Kadima (IL)

(73) Assignee: NXP USA, Inc., Austin, TX (US)

( * ) Notice: Subject to any disclaimer, the term of this patent is extended or adjusted under 35 U.S.C. 154(b) by 524 days.

(21) Appl. No.: 14/492,633

(22) Filed: Sep. 22, 2014

(65) Prior Publication Data

US 2016/0084903 A1    Mar. 24, 2016

(51) Int. Cl.
*G01R 31/3181*    (2006.01)
*G01R 31/317*    (2006.01)

(52) U.S. Cl.
CPC ... *G01R 31/31716* (2013.01); *G01R 31/3181* (2013.01)

(58) Field of Classification Search
CPC ........ G01R 31/31858; G01R 31/31725; G01R 31/3658; G01R 31/362; G01R 31/287
USPC ....................................... 324/750.3
See application file for complete search history.

(56) References Cited

U.S. PATENT DOCUMENTS

| | | | |
|---|---|---|---|
| 2009/0296797 A1* | 12/2009 | Wei .................. | H04L 1/244 375/228 |
| 2014/0111243 A1* | 4/2014 | Kumar Goel ...... | G01R 31/2601 324/762.02 |

FOREIGN PATENT DOCUMENTS

| | | |
|---|---|---|
| EP | 1890234 B1 | 11/2009 |
| WO | 2005006189 A1 | 1/2005 |

* cited by examiner

*Primary Examiner* — Melissa Koval
*Assistant Examiner* — Trung Nguyen

(57) ABSTRACT

An integrated circuit comprises a first functional unit and one or more other functional units. The first functional unit has an input for receiving data and an output for providing data. The integrated circuit tests and operates the first functional unit. Testing comprises: connecting the input of the first functional unit to the output of the first functional unit, thereby generating a loopback path from the output of the first functional unit to the input of the first functional unit; loading a test pattern onto the first functional unit; feeding a test clock signal comprising one or more clock edges, thereby prompting the first functional unit to transform the test pattern; and reading the transformed test pattern. Operating the first functional unit comprises: connecting the input of the first functional unit to an output of the other functional units; and feeding a normal clock signal to the first functional unit.

16 Claims, 4 Drawing Sheets

INTEGRATED CIRCUIT AND METHOD OF OPERATING AN INTEGRATED CIRCUIT

FIELD OF THE INVENTION

This invention relates to an integrated circuit and to a method of operating an integrated circuit.

BACKGROUND OF THE INVENTION

An integrated circuit (IC) needs to be tested before it can be reliably used. For example, test data, also refer to as test patterns, may be loaded onto an integrated circuit and be processed by the integrated circuit to generate transformed patterns which may then be compared against expected patterns to determine whether the integrated circuit has processed the test patterns correctly. The increasing complexity of integrated circuits has led to ever larger test patterns, making efficient testing of the integrated circuit difficult.

International publication number WO 2005/006189 A1 describes an automatic self-test of an integrated circuit component in which input-output (I/O) circuitry tests itself, independent of a core logic of the component. In the test mode, an output portion of an I/O buffer is connected back to an input portion of the I/O buffer, thus providing a loop-back for driving data back through the input portion of the I/O buffer. The I/O buffer can thus be tested independently of any other components that may be connected to the I/O buffer in a normal operating mode. The test does, however, not cover the core logic of the IC component.

SUMMARY OF THE INVENTION

The present invention provides an integrated circuit and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
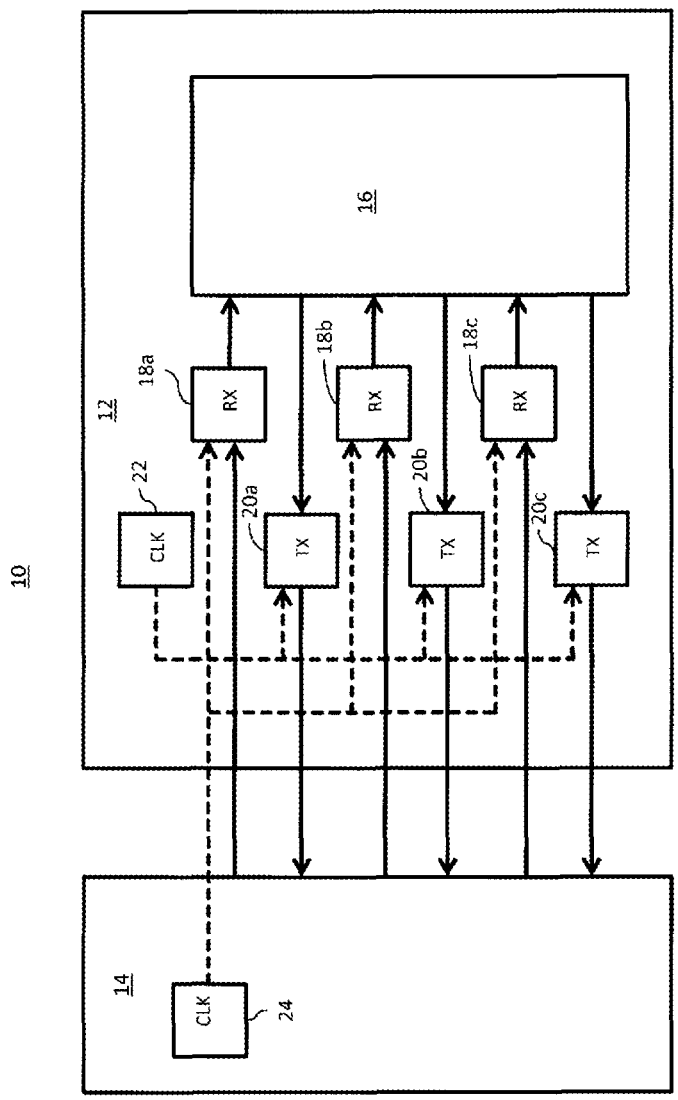
FIG. 1 schematically shows an example of an embodiment of an integrated circuit in a normal operating mode.

FIGS. 1 to 4 schematically illustrate an example of an integrated circuit 10 and an example of operating the integrated circuit 10. The integrated circuit may notably be a system-on-chip. The first functional unit may, for instance, be an integrated peripheral.

The integrated circuit 10 comprises a first functional unit 12 and one or more other functional units 14. The first functional unit has an input 18a-18c for receiving data and an output 20a-20b for providing data. The integrated circuit 10 can be operated to test the first functional unit, and it can be operated to operate the first functional unit normally.

Testing the first functional unit 12 may comprise: connecting the input of the first functional unit to the output of the first functional unit, thereby generating a loopback path from the output of the first functional unit to the input of the first functional unit; loading a test pattern onto the first functional unit; feeding a test clock signal comprising one or more clock edges to the first functional unit, thereby prompting the first functional unit to transform the test pattern; and reading the transformed test pattern from the first functional unit. Testing the first functional unit 12 may further comprise comparing the transformed test pattern against an expected pattern. When the transformed test pattern differs from the expected pattern, this may indicate that the first functional unit does not operate correctly. The integrated circuit 10 may be operable to provide the test pattern or operable to be connected to a host device and to load the test pattern from the host device, or both. The host device may, for instance, be a personal computer (PC) or any other kind of suitable computing device. Testing the first functional unit 12 may thus comprise: connecting the integrated circuit 10 to a host device; and loading the test pattern from the host device onto the first functional unit.

Operating the first functional unit 12 normally may comprise: connecting the input of the first functional unit to an output of the one or more other functional units; and feeding a normal clock signal to the first functional unit. The test clock signal may have the same or a lower frequency than the normal clock signal.

The test clock signal may differ from the normal clock signal in that it comprises a predefined limited number of clock edges. The normal clock signal may comprise an unlimited number of clock edges. In one example, the integrated circuit comprises a clock 22 arranged to provide both the test clock signal and the normal clock signal. It may thus be ensured that the test clock signal has similar or identical characteristics as the normal clock signal.

For example, the first functional unit may comprise one or more multiplexers 26a-26c for connecting the input 18a-18c of the first functional unit either to the output 20a-20c of the first functional unit or to the one or more other functional units 14 in dependence of a mode selection signal MODE.

The first functional unit may comprise a logic core 16 having an input connected to the input 18a-18c of the first functional unit and an output connected to the output 20a-20c of the first functional unit. Using the test pattern, correct functioning of the input 18a-18c, the output 20a-20c, and the logic core 16 may be tested. Therefore, loading the test pattern onto the first functional unit may comprise loading at least a part of the test pattern onto the logic core 16.

The input 18a-18c of the first functional unit 12 may notably be a source-synchronous input. In this case, the first functional unit may comprise a clock multiplexer 28 for connecting a clock input of the input 18a-18c of the first functional unit either to a clock 24 of the one or more other functional units 14 or to a clock 22 of the first functional unit 12 in dependence of a mode selection signal MODE. The proposed test configuration can thus be used also when the first functional unit 12 is arranged to communicate with the one or more other functional units using source-synchronous signals.

The input 18a-18c may comprise one or more input buffers 18a, 18b, 18c or wherein the output 20a-20c comprises one or more output buffers 20a, 20b, 20c. Loading the test pattern onto the first functional unit may comprise loading at least a part of the test pattern onto the input buffers, or onto the output buffers, or onto both the input buffers and the output buffers.

FIG. 1 schematically shows an example of an integrated circuit 10. The integrated circuit 10 may, for example, be a system-on-chip (SOC). The integrated circuit (IC) 10 may comprise a plurality of interconnected functional units, e.g., one or more integrated peripherals (IP) that may be suitably interconnected for communicating with each other, e.g., for exchanging data among each other. In the example, the IC 10 comprises a first functional unit 12 and a second functional unit 14. The IC 10 may comprise further functional units (not shown). The functional units may for instance include the following types of functional units: a processor core, a digital signal processor (DSP), a random access memory unit (RAM), and a memory access controller (MAC). In the example, the first functional unit 12 comprises a logic core 16, an input 18a-18c, and an output 20a-20c. The input 18a-18c and the output 20a-20c may be connected between the core logic 16 and the one or more other functional units, e.g., the second functional unit 14, so as to enable the core logic 16 to receive data from and send data to the one or more other functional units.

In the example, the input 18a-18c comprises a set of stateful elements, e.g., flip-flops, 18a, 18b, and 18c, connected in parallel between the core logic 16 and the one or more other functional units, so as to receive multiple bits in parallel from the one or more other functional units, e.g., from the second functional unit 14. Similarly, the output 20a-20c may comprise a set of stateful elements, e.g., flip-flops, connected in parallel between the core logic 16 and the one or more other functional units. Although only three stateful elements 18a, 18b, and 18c are shown in the Figure, the input 18a-18c may comprise less than three or more than three such stateful elements. Similarly, the output 20a-20c may comprise one, two, three, or more than three stateful elements. The input 18a-18c may serve as a buffer for buffering data received from the one or more other functional units. Similarly, the output 20a-20c may serve as a buffer for buffering data from the core logic 16 that is to be sent to the one or more other functional units, e.g., to the functional unit 14. The stateful elements of the input and of the output may also be referred to as input buffers and as output buffers, respectively, or as receive buffers and as send buffers. Each of the receive buffers 18a-18c and each of the send buffers 20a-20c may for instance be a flip-flop, a register, or any other suitable kind of stateful element.

The interface comprising the input 18a-18c and the output 20a-20c may be a source-synchronous interface. That is, incoming data received by the input 18a-18c may be clocked in accordance with clock signals from the sender unit, i.e., from the one or more other functional units. In the example, the data sent from the second functional unit 14 to the input 18a-18c of the first functional unit 10 is clocked in accordance with a clock signal from a clock 24 of the second functional unit. Similarly, the first functional unit 12 may comprise a clock 22 for synchronizing, e.g., for clocking, the data sent by the output 20a-20c to the second functional unit 14. In this example, the input 18a-18c and the output 20a-20c may serve to transfer data across a clock domain of the first functional unit and a clock domain of the second functional unit 14. However, in other examples (not shown) the data transfer between the first functional unit 12 and the one or more other functional units, e.g., the second functional unit 14, may be synchronized by a common clock signal, e.g., by a clock signal from a central clock which may be shared among the first functional unit 12, the second functional unit 14, and possibly more functional units.

The second functional unit 14 may have an architecture similar to that of the first functional unit 12. More specifically, the second functional unit 14 may comprise a logic core, an input and an output comparable to the logic core 16, the input 18a-18c, and the output 20a-20c of the first functional unit 12. Thus the circuitry of the first functional unit 12 as represented in FIG. 1 may be present similarly in the second functional unit 14.

The first functional unit 12 may further comprise scan circuitry (not shown) for loading data, e.g., a test pattern, onto the logic core 16, the input 18a-18c, and the output 20a-20c of the first functional unit 12. More specifically, the scan circuitry may enable loading the data onto the logic core 16, the input 18a-18c, and the output 20a-20c while the functional unit 10 is in a stop state so as to ensure that the first functional unit 12 does not process the data while the data is being loaded onto the first functional unit 12. The scan circuitry may for instance comprise one or more scan chains (not shown) for shifting the data into the various stateful elements of the functional unit 12 and similarly for shifting data out of the stateful elements of the first functional unit 12. Shifting the data in or out may involve a scan protocol, e.g., JTAG. The use of scan chains in integrated circuits is familiar to the skilled person and is therefore not further described herein. The one or more other functional units, e.g., the second functional unit 14, may comprise similar scan circuitry.

The integrated circuit 10 may thus be tested by loading a large test pattern onto the integrated circuit 10, e.g., onto the various interconnected functional units of the integrated circuit, e.g., onto the first functional unit 12 as well as the second functional unit 14, and then operating the integrated circuit 10 during a test period comprising a certain number of clock cycles, thus operating the integrated circuit 10 to transform the test pattern. The transformed test pattern may then be read from the integrated circuit 10 using the scan circuitry and be compared against an expected pattern. Such testing can, however, be cumbersome and time consuming because it involves the entire integrated circuit 10. In practice it may be desirable to test individual functional units of an integrated circuit, e.g., the IC 10, individually. In a normal operating configuration of the integrated circuit it may, however, be difficult or impossible to test a selected functional unit individually because the latter is not an isolated system but may respond to signals or data received from other functional units of the integrated circuit. In the shown example, the first functional unit 12 may receive data from the second functional unit 14 while being tested and hence it may be difficult or impossible to draw conclusions from the state of the first functional unit 12 at the end of the testing period without knowing the data received by the first functional unit 12 from the second functional unit 14.

Figure 2:
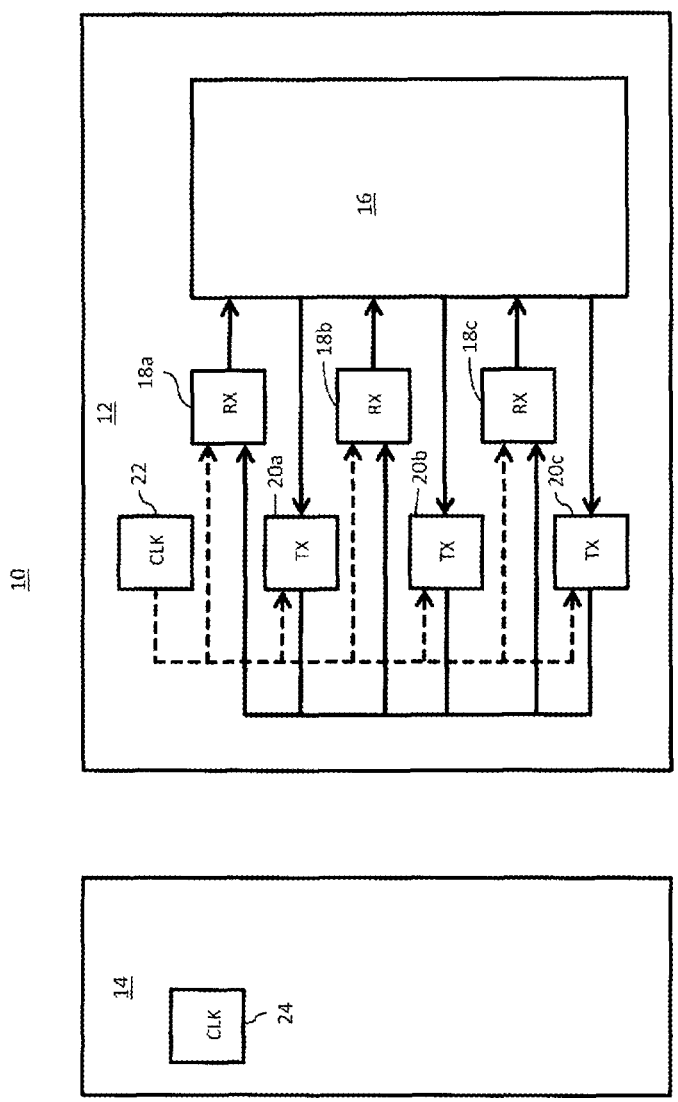
FIG. 2 schematically shows an example of an integrated circuit in a test mode.

Referring now to FIG. 2, an example of a refinement of the integrated circuit 10 described above in reference to FIG. 1 is described. In this example, the first functional unit 12, e.g., an integrated peripheral, comprises configuration circuitry (not shown in FIG. 2) for configuring the first functional unit 12 to be in a configuration selected among two or more possible configurations. The possible configurations may include at least a normal configuration, described above in reference to FIG. 1, and a loop-back configuration in which at least part of the output data provided by the output 20a-20c is routed back to the input 18a-18c. More specifically, when the first functional unit 12 is in the loop-back configuration, each of the input buffers 18a-18c may be arranged to receive data from a respective output buffer 20a-20c. For example, a data input of each of the input buffers 18a-18c may be connected directly to a data output of a respective one of the output buffers 20a-20c. In the shown example, still referring to the loop-back configuration illustrated in FIG. 2, the input buffer 18a may have its data input connected directly to the data output of the output buffer 20a. Similarly, the input buffer 18b may have its data input connected directly to the data output of the output buffer 20b. Similarly, the input buffer 18c may have its data input connected directly to the data output of the output buffer 20c. Each of the input buffers 18a-18c may thus be arranged to receive data from within the first functional unit 12 instead of data from the second functional unit 14.

Furthermore, when the first functional unit 12 is in the loop-back configuration, and now considering the example in which the input 18a-18c and the output 20a-20c are arranged to operate in a source-synchronous manner, the input 18a-18c may be arranged to be synchronized by the clock 22 of the first functional unit 12. This may be implemented, for instance, by disconnecting a clock input of each of the input buffers 18a-18c from the clock 24 of the second functional unit and connecting the respective clock inputs instead to the clock 22 of the first functional unit 12.

In one example, when the first functional unit 12 is in the loop-back configuration (see again FIG. 2), the first functional unit 12 does not have any data inputs connected to an output of the second functional unit 14. The first functional unit 12 may then be completely independent of any data provided by the second functional unit 14. In another example, one or more input buffers, e.g., 18a-18c, may have their data inputs disconnected from the second functional unit while another input buffer (not shown) of the first functional unit 12 remains connected to the second functional unit 14. In either case testing the first functional unit 12 may be simplified by placing the first functional unit 12 into the loop-back configuration.

Figure 3:
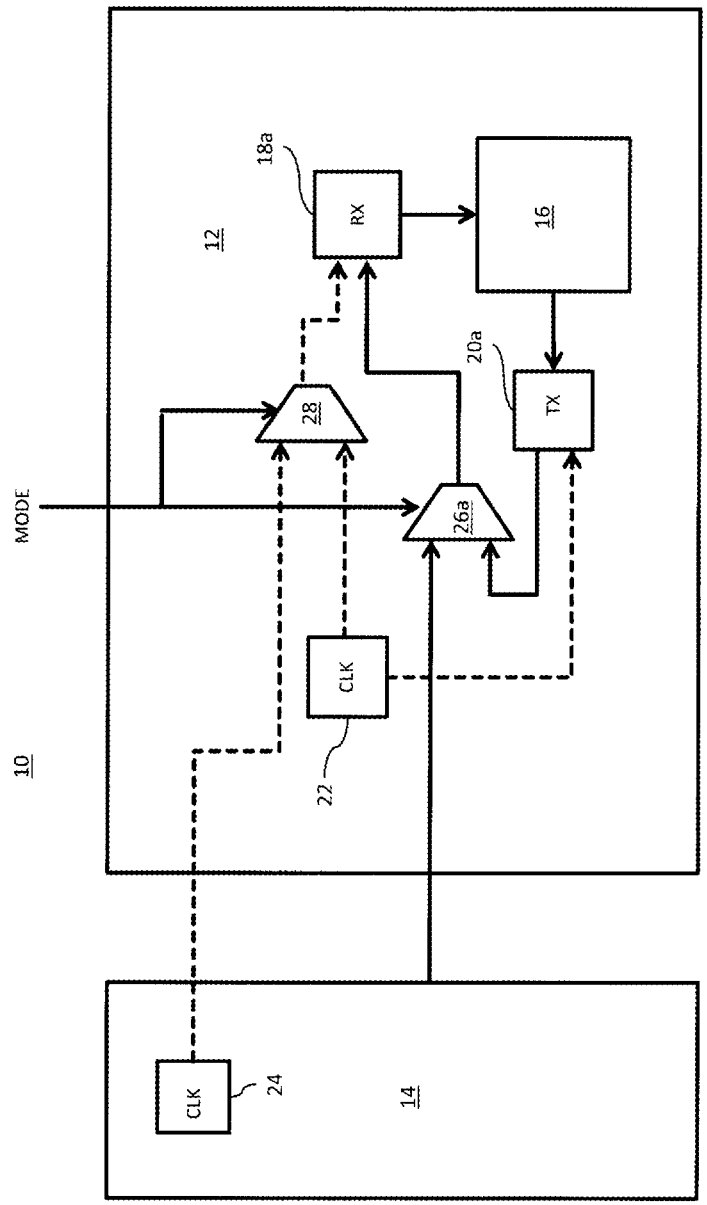
FIG. 3 schematically shows an example of an embodiment of switching circuitry in an integrated circuit, for switching between a normal operating mode and a test mode.

An example of an embodiment of configuration circuitry as may be implemented in the first functional unit 12 is described in reference to FIG. 3. In the example, the configuration circuitry may comprise one or more multiplexers associated with the one or more input buffers 18a-18c and operable to provide the respective input buffers 18a-18c either with data from the second functional unit 14 or with data from the respective output buffers 20a-20c of the first functional unit 12. For instance, as shown in FIG. 3, the data input of the input buffer 18a may be connected to an output of a multiplexer 26a of the configuration circuitry. The configuration circuitry may additionally comprise multiplexers 26b and 26c (not shown) associated with the input buffers 18b and 18c, respectively. The multiplexer 26a may have an output connected to the data input of the input buffer 18a, a first input connected to an output of the first functional unit 14, and a second input connected to a data output of the output buffer 20a. The multiplexers 26b and 26c (not shown in FIG. 3) may be connected to the second functional unit 14 and to the respective input buffers 18b, 18c and the respective output buffers 20b and 20c in similar fashion. Each of the multiplexers 26a-26c may be responsive to a mode selection signal MODE so as to connect the data input of the respective input buffer, e.g., 18a, 18b, or 18c, through to either the second functional unit 14 or to the data output of the respective output buffer, e.g., 20a, 20b, or 20c. The first functional unit 12 may thus be configured alternatively to the normal configuration (see FIG. 1) or to the loop-back configuration (see FIG. 2).

Furthermore, in a source-synchronous implementation, the configuration circuitry may comprise a further multiplexer 28 referred to herein as a clock multiplexer. The clock multiplexer 28 may have an output connected to a clock input of the input 18a-18c, a first input connected to the clock 24 of the second functional unit, and a second input connected to the clock 22 of the first functional unit. The clock multiplexer 28 may thus be operated to clock the input 18a-18c either by the clock 22 or by the clock 24. More specifically, the clock multiplexer 28 may be responsive to the mode selection signal, e.g., in a manner similar to the multiplexers 26a-26c. That is, when the mode selection signal has a first value, the clock multiplexer 28 may output the clock signal from the clock 24 of the second functional unit, thereby enabling a source-synchronous data transfer from the second functional unit 14 to the first functional unit 12. In contrast, when the mode selection signal indicates the second value the clock multiplexer 28 may output the clock signal from the clock 22 of the first functional unit 12. Thus a source-synchronous loop-back path from the output 20a-20c to the input 18a-18c may be provided.

Figure 4:
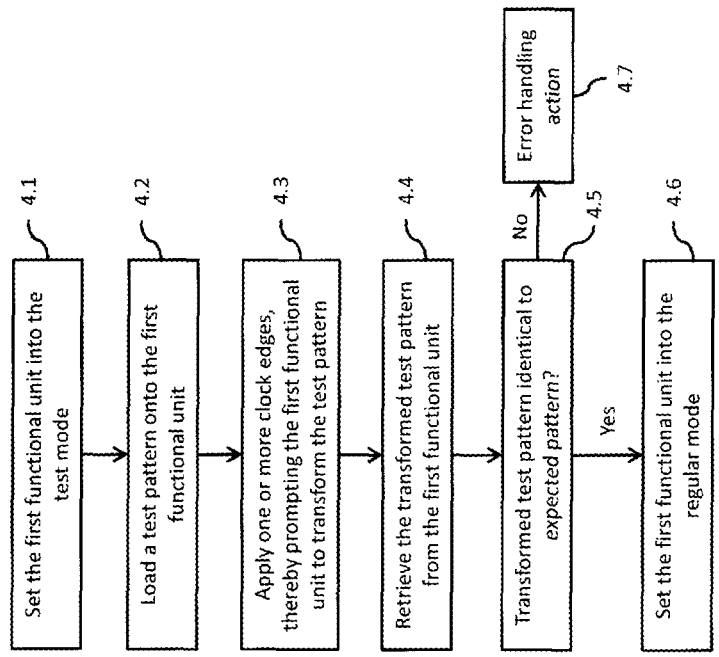
FIG. 4 shows a flow chart of an example of an embodiment of a method of operating an integrated circuit.

An example of a method of testing the first functional unit 12 is described in reference to the flow chart in FIG. 4. In the example, the method may start with configuring the first functional unit 12 to be in the loop-back configuration (Box 4.1). The first functional unit 12 may thus be logically decoupled, at least partially, from the second functional unit 14. The first functional unit 12 may thus be switched to a loop-back configuration, e.g., a configuration as illustrated in FIG. 2. A test pattern may then be loaded onto the first functional unit 12 (Box 4.2). The test pattern may be loaded onto the first functional unit 10 using scan circuitry, for example. For instance, a host device (not shown) may be connected to the integrated circuit 10 and the test pattern may be copied from the host device to the first functional unit 12. The input 18a-18c, e.g., the input buffers 18a-18c, as well as the output 20a-20c, e.g., the output buffers 20a-20c, and the logic core 16 may thus be set into a known test state. It is noted that loading a test pattern to the first functional unit 12 may be equivalent to setting the first functional unit 12 to a certain test state. In other words, each stateful element of the first functional unit 12, or at least each stateful element of interest in the first functional unit 12, may be set to its own individual test state. A simple example of a possible test state is a state in which every stateful element of the first functional unit 12 has the value 0. Another simple example of a test state is one in which each stateful element has the value 1. However, any possible state of the first functional unit 12 may, in principle, be chosen as a test state.

The first functional unit 12 still being in the loop-back configuration, one or more clock edges may then be applied to the first functional unit 12. For example, an internal clock, e.g., the clock 22, of the first functional unit 12 may be operated for a certain number of clock cycles, e.g., one or more clock cycles. Alternatively, a clock signal from an external clock, e.g., from the host device (if present), may be fed to the first functional unit 12. In either case the clock signal, e.g., from the clock 22, may drive the first functional unit 12 to undergo a sequence of one or more state transitions. More specifically, each triggering edge of the clock signal may prompt the first functional unit 12 to undergo a transition from its current state to a subsequent state. Triggering edges may include only rising edges, or only falling edges, or, in a double rate processing scheme, both rising edges and falling edges. The state transitions of the first functional unit 12 may be equivalent to a transformation of the test pattern into a transformed pattern. In this process, the input 18*a*-18*c* may receive data from the output 20*a*-20*c*. As explained above, this may have the advantage of processing only internal data of the first processing unit 12, or at least receiving less data from an environment of the first functional unit 12, compared to an alternative method (which is not the object of the present disclosure) in which the first functional unit 12 is tested in a normal configuration rather than in a loop-back configuration. Also it is pointed out that the logic core 16 may remain in its normal configuration during the test. The logic core 16 may thus undergo a sequence of one or more non-trivial state transitions which may depend on the data received from the input 18*a*-18*c*. In a variant of the example, the integrated circuit 10 may comprise a test pattern generator for providing the test pattern and for loading it onto the first functional unit 12.

The transformed test pattern may then be compared against an expected pattern. To this end, the transformed pattern may be read from the first functional unit 12 (Box 4.4), e.g., using scan circuitry of the first functional unit 12. For instance, the transformed pattern, i.e., the state of the first functional unit 12 upon completion of the series of one or more state transitions, may be copied to a host device. The host device may then compare the transformed test pattern against the expected pattern (Box 4.5).

If the transformed test pattern matches the expected pattern, this may be an indication that the first functional unit 12, including the core logic 16, the input 18*a*-18*c*, and the output 20*a*-20*c*, functions correctly. The integrated circuit 10 may then, for example, be sold to a customer or be installed in a system, or be subjected to further tests, e.g., tests involving one or more other functional units of the integrated circuit 10. Eventually, when the integrated circuit 10 is ready to be used, the first functional unit 12 may be set to its normal configuration (Box 4.6).

If, however, the transformed test pattern does not match the expected pattern, an error handling action may be initiated (Box 4.7). The error handling action may comprise, for instance, repeating the test, or analyzing the transformed test pattern, e.g., to identify an error source preparing the integrated circuit 10, or disposing of the IC 10.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. For example, the integrated 10 may be operated in the normal mode before being operated in the test mode. Also, several test runs may be performed, involving several test patterns, before concluding whether the integrated circuit operates correctly.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit comprising a first functional unit and one or more other functional units, wherein the first functional unit has an input for receiving data and an output for providing data, and wherein the integrated circuit is operable to test the first functional unit and operable to operate the first functional unit normally, and wherein testing the first functional unit comprises:
   connecting the input of the first functional unit to the output of the first functional unit, thereby generating a loopback path from the output of the first functional unit to the input of the first functional unit, wherein the loopback path is internal to the first functional unit;
   loading a test pattern onto the first functional unit;
   feeding a test clock signal comprising one or more clock edges to the first functional unit, thereby prompting the first functional unit to transform the test pattern; and
   reading the transformed test pattern from the first functional unit;
   wherein operating the first functional unit normally comprises:
      connecting the input of the first functional unit to an output of the one or more other functional units; and
      feeding a normal clock signal to the first functional unit.

2. The integrated circuit of claim 1, wherein the first functional unit comprises a logic core having an input connected to the input of the first functional unit and an output connected to the output of the first functional unit.

3. The integrated circuit of claim 2, wherein loading the test pattern onto the first functional unit comprises loading at least a part of the test pattern onto the logic core.

4. The integrated circuit of claim 1, comprising a clock arranged to provide both the test clock signal and the normal clock signal.

5. The integrated circuit of claim 1, wherein the first functional unit comprises one or more multiplexers for connecting the input of the first functional unit either to the output of the first functional unit or to the one or more other functional units in dependence of a mode selection signal.

6. The integrated circuit of claim 1, wherein the input of the first functional unit is a source-synchronous input and the first functional unit comprises a clock multiplexer for connecting a clock input of the input of the first functional unit either to a clock of the one or more other functional units or to a clock of the first functional unit in dependence of a mode selection signal.

7. The integrated circuit of claim 1, wherein the input comprises one or more input buffers or wherein the output comprises one or more output buffers.

8. The integrated circuit of claim 7, wherein loading the test pattern onto the first functional unit comprises loading at least a part of the test pattern onto the input buffers, or onto the output buffers, or onto both the input buffers and the output buffers.

9. The integrated circuit of claim 1, operable to provide the test pattern or operable to be connected to a host device and to load the test pattern from the host device.

10. The integrated circuit of claim 1, wherein the integrated circuit is a system-on-chip.

11. The integrated circuit of claim 1, wherein the first functional unit is an integrated peripheral.

12. A method of operating an integrated circuit, the integrated circuit comprising a first functional unit and one or more other functional units, wherein the first functional unit has an input for receiving data and an output for providing data, and wherein the method comprises testing the first functional unit and operating the first functional unit normally, wherein testing the first functional unit comprises:
   connecting the input of the first functional unit to the output of the first functional unit via a multiplexor, thereby providing a loopback path from the output of the first functional unit to the input of the first functional unit, wherein the loopback path is internal to the first functional unit;
   loading a test pattern onto the first functional unit;
   feeding a test clock signal comprising one or more clock edges to the first functional unit, thereby prompting the first functional unit to transform the test pattern into a transformed pattern; and
   reading the transformed pattern from the first functional unit;
   and wherein operating the first functional unit normally comprises:
      connecting the input of the first functional unit to an output of the one or more other functional units via the multiplexor; and
      feeding a normal clock signal to the first functional unit.

13. The method of claim 12, wherein the first functional unit comprises a logic core and loading the test pattern onto the first functional unit comprises loading at least a part of the test pattern onto the logic core.

14. The method of claim 12, wherein testing the first functional unit comprises:
   connecting the integrated circuit to a host device; and
   loading the test pattern from the host device onto the first functional unit.

15. The integrated circuit of claim 10, wherein the first functional unit is an integrated peripheral.

16. The method of claim 13, wherein testing the first functional unit comprises:
   connecting the integrated circuit to a host device; and
   loading the test pattern from the host device onto the first functional unit.

* * * * *